United States Patent [19]
Kleische

[11] 4,053,848
[45] Oct. 11, 1977

[54] CIRCUIT ARRANGEMENT FOR COMBINING HIGH FREQUENCY POWER COMPONENTS

[75] Inventor: Wilhelm Kleische, Berlin, Germany

[73] Assignee: Licentia Patent-Verwaltungs-G.m.b.H., Frankfurt am Main, Germany

[21] Appl. No.: 682,502

[22] Filed: May 3, 1976

[30] Foreign Application Priority Data

May 3, 1975 Germany .............................. 2519845

[51] Int. Cl.$^2$ ........................... H03F 3/60; H03F 3/30
[52] U.S. Cl. ...................................... 330/53; 330/279; 330/295; 330/124 R; 330/128; 330/134; 331/183
[58] Field of Search .................. 330/29, 30 R, 53, 84, 330/124 R, 127, 128, 134; 333/17 L; 331/183

[56] References Cited
U.S. PATENT DOCUMENTS

| | | | |
|---|---|---|---|
| 3,021,490 | 2/1962 | Kompfner | 330/84 X |
| 3,711,782 | 1/1973 | Perrero et al. | 330/30 R |

*Primary Examiner*—James B. Mullins
*Attorney, Agent, or Firm*—Spencer & Kaye

[57] ABSTRACT

A circuit arrangement for combining high frequency power components with the same frequency which come from amplifiers or generators and are fed to a 90° parallel circuit bridge having two substantially decoupled inputs with the input resistance values of these inputs depending on the output load. The operating voltage supplies of the amplifiers or generators are separately controllable and are controlled so that the output powers of these amplifiers or generators, respectively, remain substantially constant even with mismatching.

8 Claims, 2 Drawing Figures

CIRCUIT ARRANGEMENT FOR COMBINING HIGH FREQUENCY POWER COMPONENTS

BACKGROUND OF THE INVENTION

The present invention relates to a circuit arrangement for combining high frequency power components of the same frequency which come from amplifiers or generators and are fed to a 90° parallel circuit bridge having two substantially decoupled inputs, with the input resistance values of the power components depending on the output load of the circuit bridge.

For high power transmitters it is often necessary to connect a plurality of amplifier elements, e.g., tubes, transistors or the like, in parallel in the final stage in order to obtain the desired output energy. This applies in particular for transistors since at present the maximum output power of high frequency transistors lies only in the order of magnitude of 100 W. The following comments are therefore directed to transistors although in principle they can also be transferred to other amplifier elements, e.g., tubes.

Since a direct parallel connection of transistors involves considerable difficulties and has some drawbacks, it is the custom to effect such parallel connections via parallel circuit arrangements, particularly in the form of parallel circuit bridges. In this way the transistors are decoupled from one another in the parallel connection.

Two groups of parallel circuit bridges are known: bridges with inputs which are fed in phase (or shifted in phase by 180°) and bridges which are fed with a 90° shift in phase (90° bridges). The 90° bridges, usually as so-called 3 dB couplers in the form of 2 × λ/4 bridges with coupled lines (where λ = wavelength), are employed most often.

In a 90° bridge, different input resistances will appear at the inputs if the load resistance or the antenna are mismatched and this has the result that the generators to be connected in parallel, i.e., the generators or amplifiers whose outputs are connected to the inputs of the 90° bridge, receive different terminating resistances. For one of the generators its terminating resistance will appear in inverted form compared to the other generator.

For high frequency power amplifiers in class C operation the output power $P_o$ is approximately $$P_o \sim \frac{V_{CE}^2}{2R}$$

where $V_{CE}$ is the collector voltage and
R is the collector load resistance of the output stage transistor.

The output power $P_o$ is thus inversely proportional to the load resistance R. With the same direct collector voltage for both generators (or amplifiers) to be connected in parallel, a mismatched 90° bridge would cause the two generators to emit different powers because, due to the mismatch, R would be different for both generators. With greater mismatches the difference becomes considerable. In order to make such mismatches possible without endangering the amplifying elements, the latter must be given sufficient dimensions with respect to their maximum permissible power loss. This considerably increases the costs for the prior art transmitter output stages.

A further drawback of a mismatched 90° bridge is that the efficiency of the transmitter is poorer when compared to proper matching because the output power $P_s$ of the transmitter with a mismatch drops to $$P_s = P_o \frac{4s}{(s + 1)^2}$$

Here again, as above, $P_o$ is the output power with matching. The difference in power flows as loss energy into the dummy resistor at the output of the bridge in which no power is destroyed if there is matching.

SUMMARY OF THE INVENTION

It is the object of the present invention to provide a circuit arrangement in which over-dimensioning of the amplifying elements with respect to power losses can at least in part be avoided.

It is a further object of the present invention to prevent a significant loss of efficiency of the parallel connected amplifiers or generators, respectively, due to mismatching.

This is accomplished according to the invention in that in a circuit arrangement for combining high frequency power components with the same frequency, which circuit arrangement includes two amplifiers or generators for producing the high frequency power components whose outputs are coupled to the two substantially decoupled inputs of a 90° parallel circuit bridge whose input resistance values depend on the load connected to the output, the operating voltage supply for each of the above-mentioned amplifiers or generators, respectively, is separately controllable, and means are provided for controlling these operating voltage supplies so that the output power of these amplifiers or generators, respectively, remains substantially constant even with mismatching. It will usually be sufficient if the last amplifier stage before the associated input of the parallel circuit bridge is regulated. It will then of course not be possible to effect this regulation over an infinitely large range but it is assured in this way that with mismatch values within given limits, the output power of the amplifiers or generators, respectively, will deviate less from the output power obtained with matching than would occur without the regulation according to the invention.

The measures according to the invention, serve to avoid over-dimensioning of an amplifier or generator, respectively, in view of the possible occurrence of mismatching and additionally serve to avoid the reduction in efficiency and in the output power of the parallel circuit due to mismatching.

DESCRIPTION OF THE PREFERRED EMBODIMENTS

Figure 1:
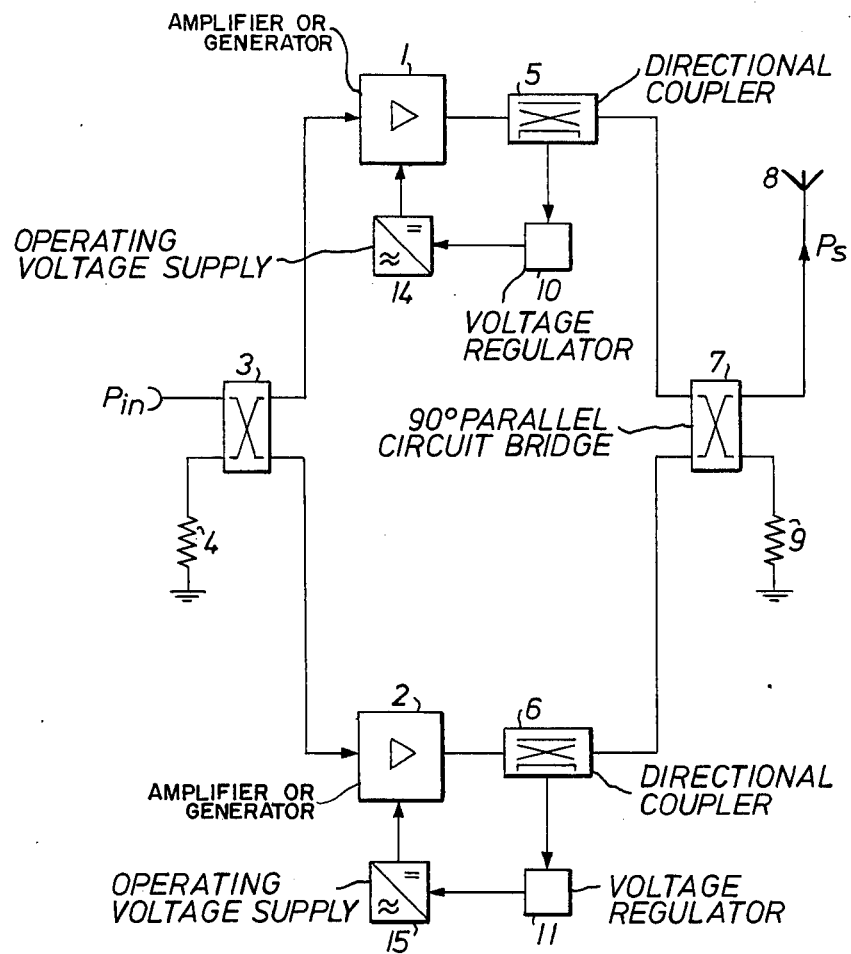
FIG. 1 is a block circuit diagram of an embodiment of the circuit arrangement according to the invention.

As shown in FIG. 1, the circuit arrangement according to the invention includes two parallel circuit branches each containing an amplifier 1 or 2, respectively, which are fed by a 90° parallel circuit bridge 3 in the form of a 90° coupler (3 dB coupler or 3 dB hybrid) to whose input gate the input power $P_{in}$ is fed while a further gate is connected to a compensating or dummy resistor 4. Within each parallel circuit branch the output of each of the amplifiers 1 and 2 is connected via a directional coupler 5 or 6, respectively, to a respective input or gate of a 90° parallel circuit bridge 7, which is also designed as a 90° coupler. The outputs of this parallel circuit bridge 7 are connected to an antenna 8, into which flows the transmitter output power $P_t$, and to a compensating or dummy resistor 9. The directional couplers 5 and 6 serve to couple out part of the energy flowing from the amplifiers 1 and 2 respectively in the direction toward the 90° parallel circuit bridge 7 for reasons to be explained below.

For constant output power $P_o$ of amplifiers 1 and 2, respectively, their operating voltage is almost proportional to $\sqrt{R}$, where R is the collector load resistance of the amplifier element which forms the last amplifier stage before the associated input of the parallel circuit bridge 7. This is so since $$V_{CE} \sim \sqrt{2 R P_o}$$

and since the operating voltage deviates but slightly from the direct collector-emitter voltage $V_{CE}$ of the last amplifier element of the last stage of the amplifier. This collector load resistance R is proportional to the associated input resistance of the 90° parallel circuit bridge 7. Usually a transformer network is disposed between the amplifier element and the associated input of the 90° parallel circuit bridge to transform, preferably transform down, the input resistance of the parallel circuit bridge to the required collector load resistance.

According to the above considerations, it is necessary to order to obtain constant output powers for amplifiers 1 and 2 to regulate their operating voltages independently of one another in proportion to the square root of the associated input resistance values of the 90° parallel circuit bridge 7. This is effected by operating voltage regulators 10 and 11 which are each controlled by an associated monitoring device, which in the illustrated embodiment are the directional couplers 5 and 6, respectively. The operating voltage regulators 10 and 11 themselves control the operating voltage supplies 14 and 15, respectively, which must be independently regulatable, for the associated amplifiers 1 and 2, respectively, at least to the extent that the operating voltages for amplifiers 1 and 2 can be regulated independently of one another. This does not exclude that parts of the operating voltage supply devices 14 and 15 may be combined as long as separate adjustability of the operating voltages for the amplifiers 1 and 2 is not impeded.

The directonal couplers 5 and 6, respectively, serving as monitoring devices for the output power of each amplifier 1 and 2, respectively, simultaneously indirectly monitor the associated input resistance value of the 90° parallel circuit bridge 7 and thus also serve as monitoring devices, respectively, for these input resistance values.

With mismatching the output powers of amplifiers 1 and 2 are kept approximately constant by means of proportional regulation. This regulation operates as follows:

Part of the incident wave is coupled out in directional couplers 5 or 6, respectively. This constitutes a measure for the incident power.

The coupled out incident wave from each of the couplers 5 and 6 is fed to the associated operating voltage regulators 10 or 11, respectively, where it is rectified to provide a direct voltage, which serves as a measure for the associated incident power, and this direct voltage is compared in a comparator with a reference direct voltage which corresponds to the rated value of the output power of amplifiers 1 and 2, respectively.

If the direct voltage obtained by rectification of the decoupled incident wave deviates from the reference direct voltage, operating voltage regulator 10 or 11, respectively, furnishes a regulating voltage which controls the operating voltage supply 14 or 15, respectively, whose output voltage must be electronically regulatable, so that the direct voltages at the comparator are approximated to one another except for a small residual error which is required to maintain the regulating state. Thus the incident powers of amplifiers 1 and 2 are also regulated approximately to their rated values since these are proportional to the direct voltages obtained by rectification of the decoupled incident wave.

With mismatching, the monitoring devices 5 and 6 and operating voltage regulators 10, 11 reduce the operating voltage for that one of amplifiers 1 and 2, respectively, whose operating resistance has dropped and raise the operating voltage for that one of amplifiers 2 and 1, respectively, whose operating resistance has increased. Of course, a prerequisite is that with proper matching amplifiers 1 and 2, respectively, operate with an operating voltage which is sufficiently below the maximum permissible operating voltage so that the latter will not be exceeded during regulation. In other words: the amplifier element whose operating voltage is regulated upwardly must have a maximum permissible operating voltage which lies at the upper limit of the regulating range. This applies correspondingly for the current in the amplifier element whose operating voltage is regulated downwardly since it, in order to furnish constant power, must operate with a higher current. This means simultaneously that the regulating range within which the operating voltage can be regulated according to the occurring mismatch cannot be arbitrarily large but must, of necessity, be limited to a range which accounts for the mismatch values of the antenna 8 as they occur in practice.

The present invention accomplishes, on the one hand, that the amplifier elements which form the output stages of the parallel connected amplifiers 1 and 2 must have no more than a maximum possible loss power which lies barely above the power occurring with perfect matching. On the other hand, it is accomplished that the amplifier elements, when a 90° parallel circuit bridge is employed, have approximately identical loads even with mismatching and that no significant amounts of energy are lost in the load compensating or dummy resistor 9 so that the efficiency of the transmitter will not drop significantly with mismatching.

Figure 2:
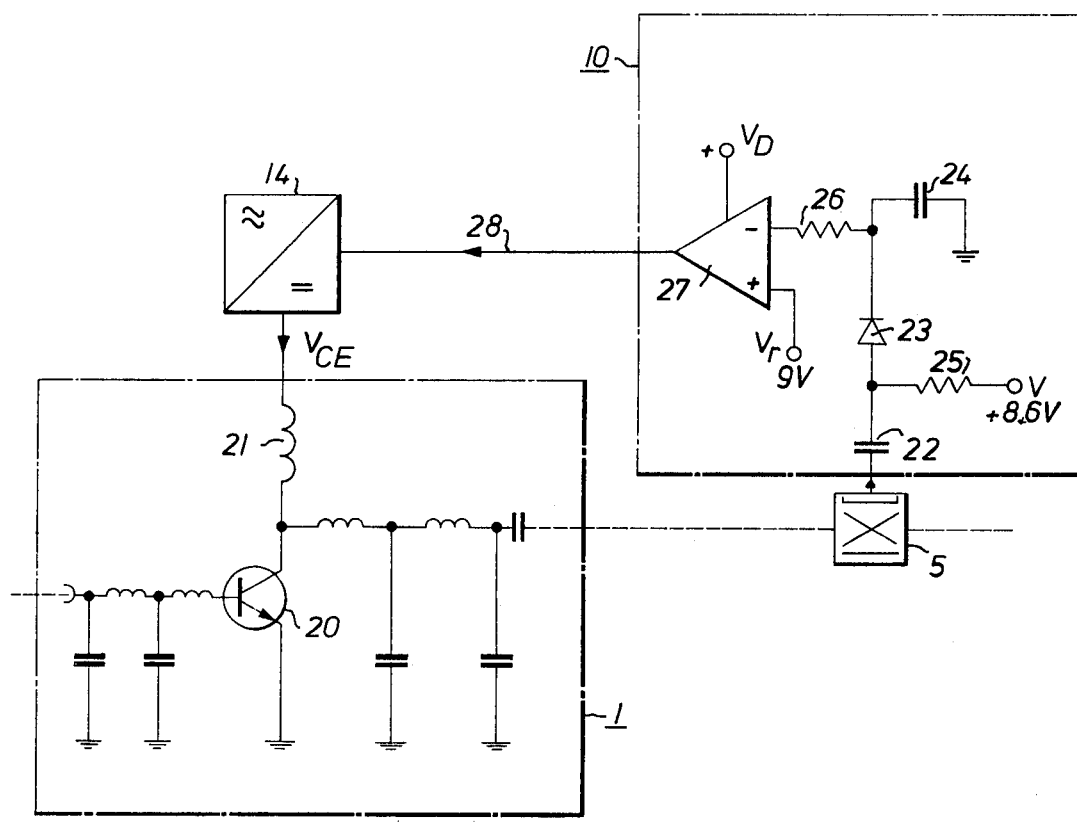
FIG. 2 shows details of the circuits 1, 5, 10 and 14 of FIG. 1.

FIG. 2 shows for the amplifier 1, the power transistor 20 which is driven hard and which preferablly works in class B or class C operation. The base of transistor 20 is preceded by a low-pass filter network of conventional design, and the collector of the transistor 20 is followed by a similar network. The collector direct voltage $V_{CE}$ which can e.g., be regulated over a range from +16 to +24 v, is applied via a choke 21.

Capacitor 24 in the voltage regulator 10 is charged via resistor 25 and silicon diode 23 from a direct voltage source V of +8.6 V. (0.6 V is lost on account of the forward voltage drop of the diode). An additional charging of capacitor 24 is effected by the positive voltage peaks of the AC volage which comes from the directional coupler 5 via capacitor 22 and is proportional to the power delivered by amplifier 1. With rated power of amplifier 1, the additional charging may e.g., amount to +1 v, so that +9 V are present at capacitor 24.

Via resistor 26 this capacitor voltage is compared in the differential amplifier 27 with the positive reference direct voltage $V_r$ which for the example quoted amounts to +9 V. In this state the differential amplifier 27 fed with the direct voltage $V_D$ delivers via line 28 a mean control voltage of e.g. 20 V to the conventional, electronically stabilized power supply 14 so that the mean value, e.g. 20 V of output voltage $V_{CE}$ of the latter is maintained.

The Regulated Power Supply E 030-10 manufactured by Delta Elektronika BV, P.O. Box 27 Zierikzee, Netherlands may for example be employed for such purpose.

If now the output power of amplifier 1 increases in an undesired manner on account of a dropping collector load resistance R of the output stage transistor 20, the capacitor 24 will be charged higher and the differential amplifier 27 will deliver via line 28 a lower control voltage, and the voltage $V_{CE}$ will consequently be regulated downward over a range from e.g. +20 to +16 V linearly in such a manner that the output power Po ~ $V_{CE}^2/2R$ will again reach approximately the rated value, although the value of R has dropped.

Under the reverse circumstances the capacitor 24 will discharge, if the amplifier power is below the rated value, to arrive at direct voltage values below $V_r$ so that the differential amplifier 27 will than deliver to the power supply 14 an increased control voltage and the latter will regulate the voltage $V_{CE}$ upward over a range of e.g. +20 to +24 V linearly so that the output power of the amplifier 1 remains essentially at its rated value inspite of the increased value of R. During this time the operating voltage $V_{CE}$ remains automatically proportional to the square root of the associated input resistance of the parallel circuit bridge 7 which in its turn is proportional to the collector load resistance R.

The voltage ranges stated are related to a controllable standing wave ratio s of approximately 1.5 and to the abovementioned regulated power supply which is used as a voltage follower.

If more than two amplifiers or generators, respectively, are interconnected via 90° parallel circuit bridges, the principle of the present invention can also be applied since, in such a case, the amplifiers or generators, respectively, which during mismatching receive the same operating resistance can be combined into a group. There then exist two groups of amplifiers or generators, respectively, which have associated to them two separately regulatable operating voltages.

It will be understood that the above description of the present invention is susceptible to various modifications, changes and adaptations, and the same are intended to be comprehended within the meaning and range of equivalents of the appended claims.

What is claimed is:

1. In a circuit arrangement for combining high frequency power components with the same frequency including a pair of amplifiers or generators for providing high frequency power components with the same frequency at their respective outputs, a 90° parallel circuit bridge having its output connected to a load and two substantially decoupled inputs, each of which is coupled to the output of a respective one of said pair of amplifiers or generators with the input resistance values of said inputs depending on said output load; the improvement comprising: a separately controlled operating voltage supply of each of said amplifiers or generators; and means for controlling said operating voltage supplies so that the output power of each of said amplifiers or generators remain substantially constant even with mismatching.

2. A circuit arrangement as defined in claim 1 wherein said means for controlling includes: first and second means for monitoring the output power of a respective one of said pair of amplifiers or generators; and first and second operating voltage regulator means, controlled by said first and second monitoring means, respectively, for regulating the associated said operating voltage supply.

3. A circuit arrangement as defined in claim 1 wherein said means for controlling includes: first and second means for monitoring said input resistance value of a respective one of said two decoupled inputs; and first and second operating voltage regulator means, controlled by the monitored said input resistance value from said first and second monitoring means respectively, for regulating the associated said operating voltage supply.

4. A circuit arrangement as defined in claim 2 wherein each of said monitoring means is a directional coupler connected between the output of one of said amplifiers or generators and the associated input of said 90° parallel circuit bridge.

5. A circuit arrangement as defined in claim 3 wherein each of said monitoring means is a directional coupler connected between the output of one of said amplifiers or generators and the associated input of said 90° parallel circuit bridge.

6. A circuit arrangement as defined in claim 5 wherein: each of said first and second regulating means regulates the associated operating voltage supply substantially proportionately to the square root of the associated input resistance value of said parallel circuit bridge.

7. A circuit arrangement as defined in claim 1 wherein the element of the amplifier whose operating voltage is regulated upwardly has a maximum permissible operating voltage which lies at the upper limit of the regulating range.

8. A circuit arrangement as defined in claim 1 wherein the element of the amplifier whose operating voltage is regulated downwardly has a sufficient reserve with respect to the permissible current.

* * * * *